US006642597B1

(12) United States Patent
Burke et al.

(10) Patent No.: US 6,642,597 B1
(45) Date of Patent: Nov. 4, 2003

(54) INTER-LAYER INTERCONNECTION STRUCTURE FOR LARGE ELECTRICAL CONNECTIONS

(75) Inventors: Peter A. Burke, Portland, OR (US); William K. Barth, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/272,767

(22) Filed: Oct. 16, 2002

(51) Int. Cl.$^7$ .......................... H01L 31/00; H01L 23/48
(52) U.S. Cl. ..................... 257/459; 257/786; 257/758
(58) Field of Search ............................. 257/459, 767, 257/786, 758, 762, 751, 774, 773

(56) References Cited

U.S. PATENT DOCUMENTS 6,313,537 B1 * 11/2001 Lee et al. .................. 257/786
6,313,540 B1 * 11/2001 Kida et al. ................ 257/786

* cited by examiner

Primary Examiner—Mark V. Prenty
(74) Attorney, Agent, or Firm—Beyer, Weaver & Thomas

(57) ABSTRACT

Embodiments of the invention include an electrical interconnection structure for connection to large electrical contacts. The electrical interconnection includes a semiconductor substrate having a conductive pad layer formed thereon. A dielectric layer having a plurality of elongate trenches is formed over the conductive pad layer such that the elongate trenches extend through the dielectric layer to the underlying conductive pad layer. Elongate conductive contacts are formed in the elongate trenches to establish electrical connections to the underlying conductive pad layer. The long axes of the elongate bar trenches can be arranged substantially parallel to the long axes of the slots formed in the copper pad. Alternatively, the long axes of the bar trenches can be arranged transversely to the long axes of the slots formed in the copper pad. In some embodiments, the conductive contacts are formed such that they establish electrical connection with sidewalls of the underlying conductive pad layer. Other embodiments address the methods of manufacturing the electrical interconnection structures of the present invention.

17 Claims, 4 Drawing Sheets

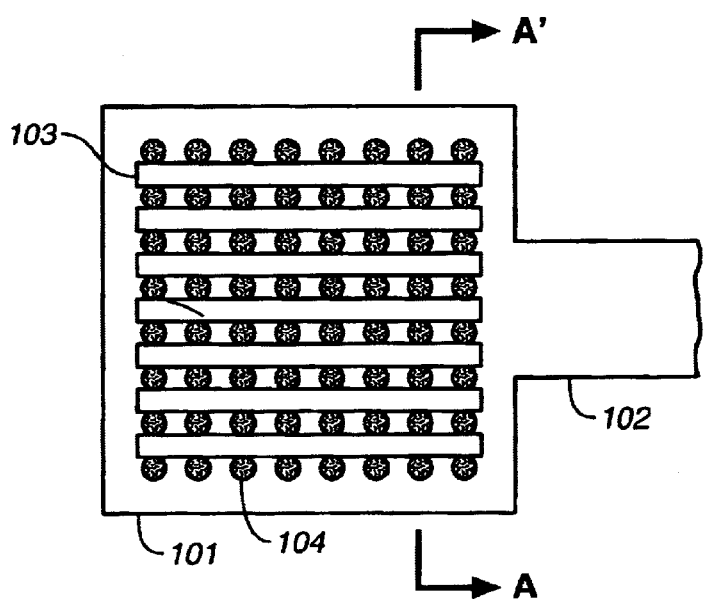
FIG._1
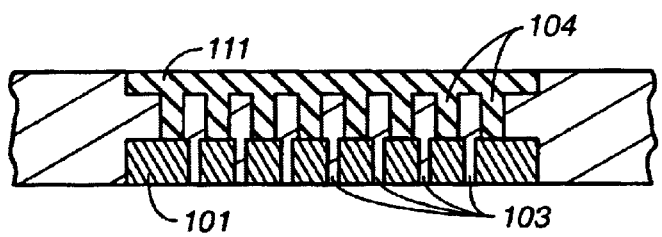
FIG._2
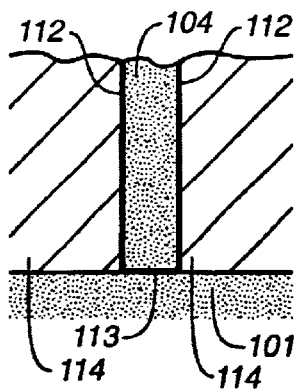
FIG._3a
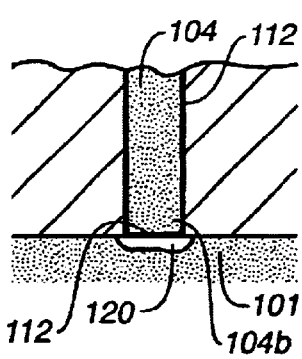
FIG._3b
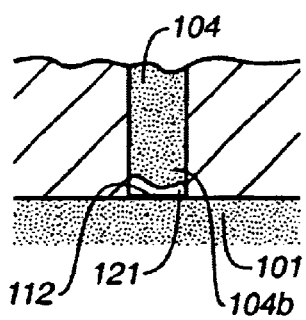
FIG._3c

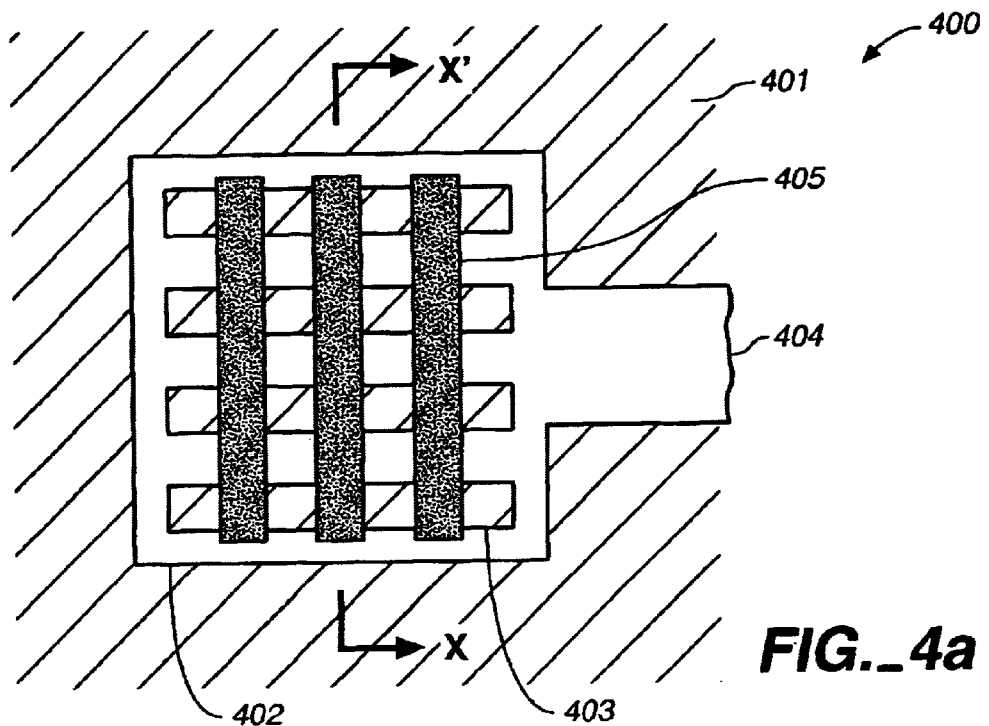
FIG._4a
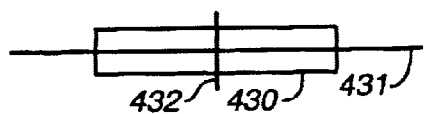
FIG._4b
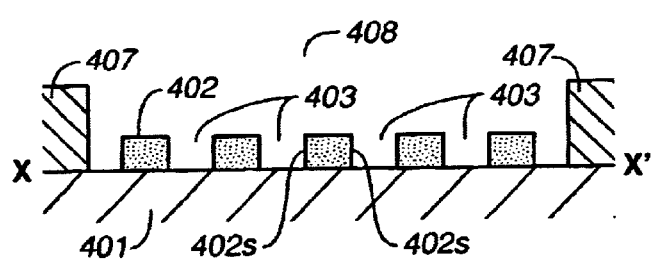
FIG._4c
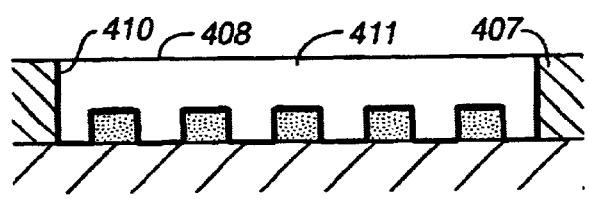
FIG._4d

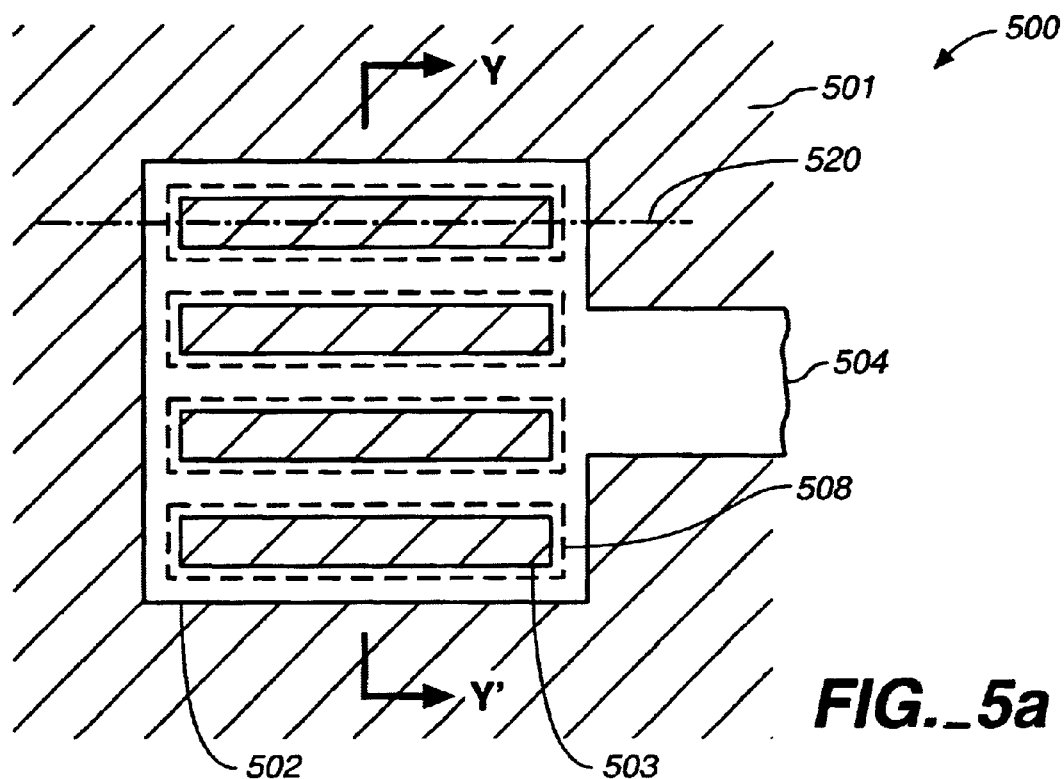
FIG._5a
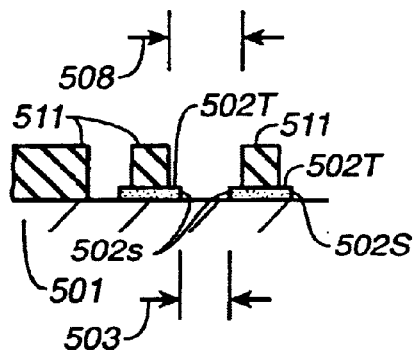
FIG._5b
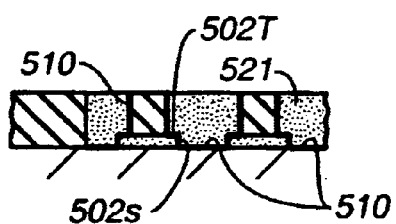
FIG._5c

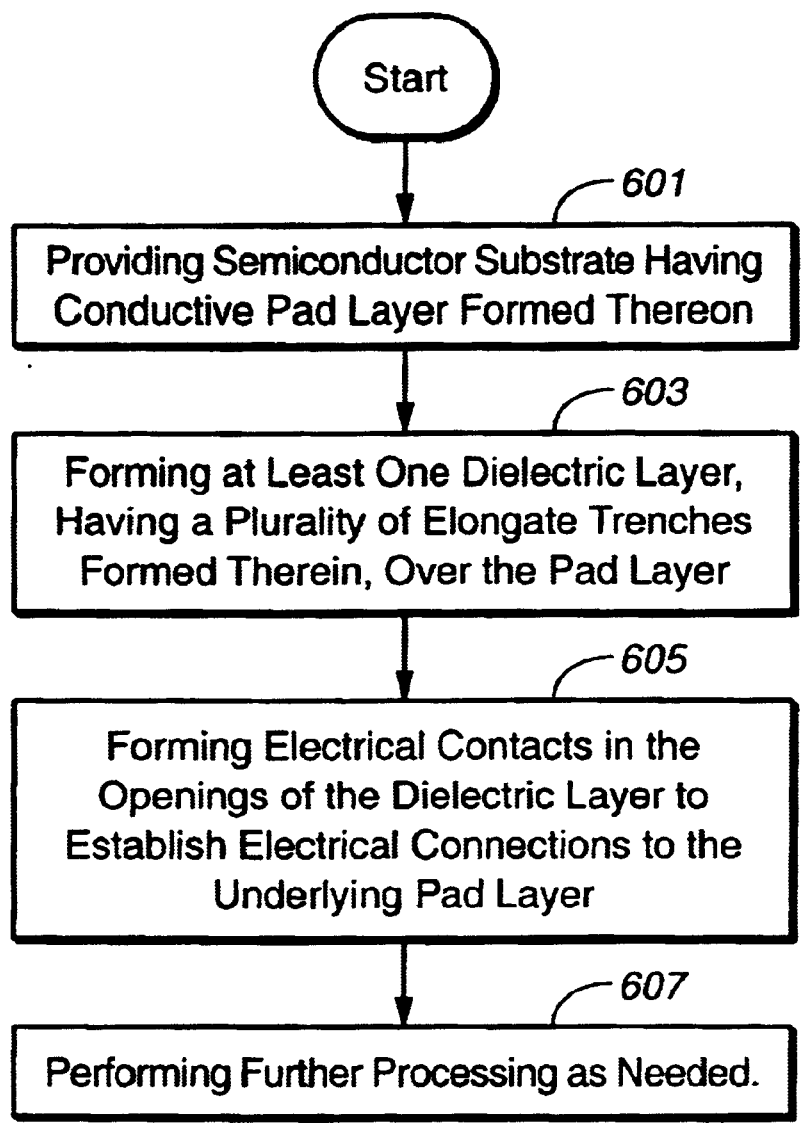
FIG._6

US 6,642,597 B1

INTER-LAYER INTERCONNECTION STRUCTURE FOR LARGE ELECTRICAL CONNECTIONS

TECHNICAL FIELD

The invention described herein relates generally to electrical interconnections in semiconductor devices. In particular, the invention relates to an improved electrical interconnection for large bond pads, bus lines, and other large or wide electrical connections. The invention also addresses methods for forming such interconnections.

BACKGROUND OF THE INVENTION

For electrical interconnections in semiconductor devices, large conducting surfaces are commonly connected to other conducting surfaces using many small interconnects that pass through many dot vias to electrically establish electrical connections. Such interconnections are commonly used for bond pads, bus lines, wide metal interconnects, as well as a host of other large electrical interconnect structures used in semiconductor electronic circuitry.

FIG. 1 is a schematic top down representation of one such structure as conventionally known in the art. A copper bond pad 101 is formed on a semiconductor substrate and electrically connected to a current line 102. In this example, the bond pad 101 is connected to a complementary bond pad (not shown in this view) formed on an overlying dielectric layer. The bond pad 101 has a number of slots 103 formed therein. The slots 103 are stress relief grooves formed in the bond pads 101. These stress relief grooves segment the larger metal masses into smaller areas, thereby avoiding metal "creep" and other stress related issues. Commonly, these slots 103 pass completely through the bond pads 101 such that the underlying substrate is exposed. A dielectric layer is then formed over the bond pads 101. Later, the complementary bond pads are formed in the dielectric layer. In order to electrically connect the copper bond pad 101 with the overlying complementary bond pad, a multiplicity of dot vias 104 are formed in the dielectric layer. These dot vias 104 (called dot vias because of their substantially circular shape) are filled with copper material to provide a conduction path between the bond pad 101 and the overlying complementary bond pad. The multiplicity of dot vias 104 is often referred to as a sea of vias.

The cross-section A–A' is depicted in FIG. 2 which illustrates the conduction paths between the bond pad 101 and the overlying complementary bond pad 111. The slots 103 in the bond pad 101, which are now filled with deposited dielectric material, are clearly depicted. Side views of sample dot vias 104 are well illustrated in this view.

Although suitable for their intended purpose, such conventional electrical interconnection approaches have certain limitations and drawbacks. One drawback is the large required size of the bond pads 101 (and 111). Another, somewhat related problem is the high electrical failure rate of the dot vias 104.

FIG. 3(a) is a close-up view of the bottom portion of a single representative dot via 104 as it makes an electrical connection with the underlying bond pad 101. The dot via 104 is lined with a diffusion barrier 112 and electrically contacts the underlying bond pad 101 through its bottom surface 113. The dot via 104 is encapsulated by the surrounding dielectric material 114. Because copper has a high diffusivity through the dielectric and silicon materials (e.g., dielectric layer 114), it is supplied with the barrier layer 112. This prevents the copper from diffusing into the surrounding dielectric materials and affecting dielectric leakage and potentially causing a host of copper contamination issues.

With continued use over time, such vias 104 are known to suffer from certain electromigration problems. FIG. 3(b) illustrates one manifestation of a typical electromigration problem. The electrical connection from bottom 104b of the dot via 104 to the underlying bond pad 101 is broken by the formation of a void 120 in the underlying copper bond pad 101. This relatively common occurrence is precipitated by the electromigration of copper in the bond pad 101 away from the material of the barrier layer 112. The depicted problem is especially troublesome because it causes a complete electrical disconnection between the dot via 104 and the underlying bond pad 101. Such electrical failures are so prevalent that they are factored in to the final size of the bond pad 101 and the number of dot vias 104. For example, the desired amount of current that must pass through the bond pad is determined. The number and size of dot vias necessary to carry the current are calculated, based upon the known dot via failure rates versus current density of vias. The predicted number of dot via failures are then factored in to obtain a final number of vias. This final number of vias is then used to determine the size of the bond pad. Therefore, in such conventional approaches, the bond pads are always larger than the minimum possible size. The bond pads are made even larger due to the need for the stress relief slots formed in the bond pads. Thus, in existing technologies, excessive surface area is taken up by the overly large electrical connectors (e.g., bond pads).

FIG. 3(c) depicts another type electromigration problem present in conventional interconnection structures. The electrical connection from bottom 104b of the dot via 104 to the underlying bond pad 101 is broken by the formation of a void 121 in the bottom portion of the dot via 104. This is precipitated by the electromigration of copper in the dot via 104 away from the material of the barrier layer 112. The depicted problem causes a substantial electrical disconnection between the dot via 104 and the underlying bond pad 101, thereby choking the amount of current that can pass through the via 104 down to a minimum. As with the above-described electromigration problem, larger than necessary bond pads are used to address the problem.

For the reasons described hereinabove, as well as other reasons, an improved inter-layer interconnection structure for large electrical connections and methods for its construction is needed.

BRIEF SUMMARY OF THE INVENTION

In accordance with the principles of the present invention, an apparatus and method for fabricating a large electrical interconnection structure for use in semiconductor devices is disclosed.

Embodiments of the invention include an electrical interconnection structure for connection to large electrical contacts. This electrical interconnection includes a semiconductor substrate having a conductive interconnect pad thereon. A dielectric layer having a plurality of elongate openings is formed over the conductive interconnect pad. The elongate openings of the dielectric layer extend through the dielectric layer to the underlying pad. Elongate conductive contacts are formed in the elongate openings to establish electrical connections to the underlying pad.

In another embodiment, the electrical interconnection structure includes a semiconductor substrate having a copper pad layer formed with a plurality of elongate slots formed therein. The slots extend into the pad layer and have a long axis, a short axis, and sidewalls. A dielectric layer having a plurality of elongate bar trenches overlies the copper pad. The bar trenches extend through the dielectric layer. Elongate conductive contacts are formed in the plurality of elongate openings to establish electrical connections to the underlying copper pad layer. In some embodiments, the elongate conductive contacts are configured to electrically connect to the sidewalls of the copper pads. In the foregoing, and other embodiments, the long axes of the plurality of elongate bar trenches can be arranged substantially parallel to the long axes of the plurality of the slots formed in the copper pad. Alternatively, the long axes of the plurality of elongate bar trenches can be arranged transversely to the long axes of the plurality of the slots formed in the copper pad.

Other embodiments address the methods of manufacturing the electrical interconnection structures of the present invention.

Other aspects and advantages of the invention will become apparent from the following detailed description and accompanying drawings, which illustrate, by way of example, aspects of the invention.

BRIEF DESCRIPTION OF THE DRAWINGS

The following detailed description will be more readily understood in conjunction with the accompanying drawings, in which:

FIG.'s 1, 2, 3(a)–3(c) describe conventional approaches and problems in known electrical interconnect structures.

FIG. 1 is a simplified plan view that depicts a conventional bond pad and sea of dot vias.

FIG. 2 is a cross-sectional view that schematically depicts a portion of the electrical interconnection structure shown in FIG. 1.

FIG. 3(a) is a schematic cross-sectional view of a dot via constructed in accordance with conventional processes.

FIG. 3(b) is a schematic cross-sectional view of the dot via depicted in FIG. 3(a) showing one instance of undervoiding caused by electromigration.

FIG. 3(c) is another schematic cross-sectional view of the dot via depicted in FIG. 3(a) showing the formation of a void in the dot via caused by electromigration.

FIG.'s 4(a)–4(d) depict various views of an embodiment of an electrical interconnection structure that include transverse bar contacts formed over the slots of an underlying pad layer in accordance with the principles of the present invention.

FIG.'s 5(a)–5(c) depict various views of an embodiment of an electrical interconnection structure that include bar contacts formed substantially parallel to and over the slots of an underlying pad layer in accordance with the principles of the present invention.

FIG. 6 is a flow diagram describing one embodiment of a suitable method for constructing a electrical interconnect structure in accordance with the principles of the present invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various method embodiments for forming conducting structures will be disclosed. In one embodiment, the present invention is directed to an improved electrical connection. FIG. 4(a) is a schematic top down representation of an electrical interconnect embodiment 400 constructed in accordance with the principles of the present invention. A conductive pad layer 402 is formed on a semiconductor substrate 401. In the depicted embodiment, the conductive pad layer 402 is connected to a current line 404 and includes a plurality of slots 403. Overlying the slots 403 and pad layer 402 is an elongate bar contact 405. The bar contact 405 makes electrical contact with the underlying pad layer 402. Typical embodiments of the elongate bar contact 405 have a long dimension in the range of about 0.5–15 $\mu$m with the short dimension of about 5 $\mu$m or less. The minimum size of the short dimension of the bar contact is defined by the minimum feature size. In some cases, this can be as small as 0.18 $\mu$m, 0.08$\mu$m, or even less. In common implementations, the ratio of long dimension to short dimension is about 3:1 or greater. As is known to those having ordinary skill in the art, lower ratios are possible. Typical embodiments utilize a single row of elongate bar contacts 405 to make the electrical connections to the underlying pad layer 402. The inventors contemplate that, in other embodiments, several rows of elongate bar contacts 405 can be used to make electrical connections to the underlying pad layer 402.

In the depicted embodiment, the semiconductor substrate 401 is a silicon wafer. However, the principles of the invention can be practiced using substrates comprising a number of other semiconductor materials. The conductive pad layer 402 can comprise bond pads, bus lines, or other wide metal line connections. Such pad layers 402 can be used to form a wide variety of other power distribution nodes or high current lines. The pad layers 402 can also be used as inter-layer power distribution sites or bond pads for taking power on and off a chip. Pad layers 402 of the present invention can be used to accomplish a wide variety of high current applications. Although depicted here with slots 403, the inventors contemplate embodiments where pad layers 402 without slots 403 can be used.

Typical pad layers 402 are formed using copper-containing materials (e.g., copper laminate structures, copper alloys, or copper compounds). In the depicted embodiment, the pad layer 402 is simply formed of copper. Such pad layers 402 can be of any size, but preferably range from about 20 $\mu$(micron)×20 $\mu$ to about 80 $\mu$×80 $\mu$ or sometimes larger. The depicted pad layer 402 includes a number of elongate slots 403. The slots 403 are grooves formed in the pad layer 402 to relieve stress. Commonly, these slots 403 pass completely through the pad layer 402 such that the underlying substrate 401 is exposed.

Referring to FIG. 4(b), the elongate openings 430 of the embodiments (e.g., slots, trenches, etc.) have a long axis 431 that extends in the direction parallel to a longer dimension of the elongate opening 430. Similarly, the elongate openings 430 have a short axis 432 that extends in a direction parallel to a shorter axis of the elongate opening 430.

Typically, a dielectric layer (depicted in other views) is formed over the pad layer 402. With continued reference to FIG. 4(a), elongate openings (or trenches) are formed in the dielectric layer. It is into these trenches that conductive materials are deposited to form the depicted electrical bar contacts 405. The trenches are configured such that the electrical bar contacts 405 form electrical connections to the underlying pad layer 402. Methods and techniques of forming these trenches are well known to those having ordinary skill in the art. In the depicted embodiment, the elongate electrical bar contacts 405 are arranged so that the long axes of the contacts 405 are transverse to the long axis of the slots 403.

Some of the advantages of the depicted configuration can be better illustrated with respect to FIG.'s 4(c) and 4(d). FIG. 4(c) is a cross-sectional view of FIG. 4(a) taken along line X–X'. A pad layer 402 is formed on the semiconductor substrate 401. In the depicted embodiment, a dielectric layer 407 is formed on the pad layer 402. The dielectric layers 407 can be formed of a wide range of dielectric materials known to those having ordinary skill in the art. In the depicted embodiment, a trench 408 is formed in the dielectric layer 407. In one embodiment, the trench 408 is formed by simply selectively etching the dielectric layer 407 to form the depicted trench 408. A vast array of etching approaches known to those having ordinary skill in the art can be used, including without limitation, damascene and dual-damascene processes. The trench 408 is typically formed such that substrate pad layer 402 is exposed in the slots 403. Typically, the underlying substrate 401 is also exposed. In some advantageous embodiments, the trench 408 exposes the pad layer 402 such that substantial portions of the sidewalls 402s of the slots 403 are exposed.

Referring to FIG. 4(d), once the trenches 408 are formed, one or more barrier layers 410 are typically formed in the trench 408 to prevent subsequently deposited copper materials from diffusing into the dielectric layer 407. Methods of forming such barrier layers 410 are known to those having ordinary skill in the art. Typically, refractory metals or refractory metals in combination with other materials are used for barrier layers. An electrically conducting contact 411 is then formed in the trench 408. Typically, the contact 411 is formed of copper-containing materials. In the depicted embodiment, the copper-containing material is copper. Methods of forming such contacts are well known to persons having ordinary skill in the art.

In further processing steps, the top of the electrical contacts 411 can be planarized, for example, chemical mechanical polishing (CMP) techniques can be used. Additionally, the tops of the electrical contacts 411 can be capped with barrier materials if desired. Techniques and materials similar to those used to form the barrier layers can also be employed. The tops of the electrical contacts 411 can also be electrically connected to other circuit elements if desired.

The depicted configuration has substantial advantages over the prior art. For one, electrical contact is now made through the heretofore unused side portions 402s of the pad layer 402. This substantially increases the electrical contact area between the electrical contacts 411 and the pad layer 402. Additionally, because this approach does not lead to open voids from electromigration, this approach offers a much increased electromigration lifetime.

FIG.'s 5(a)–5(c) depict another embodiment of the present invention. In the depicted embodiment, the elongate trenches formed in the dielectric layer are formed over the elongate slots formed in the underlying conductive pad layer. Moreover, the elongate trenches formed in the dielectric layer are arranged so that the long axes of the elongate trenches are substantially parallel to the long axes of the elongate slots formed in the underlying conductive pad layer. Conductive contacts are then formed in the trenches such that they can electrically contact the underlying pad layer.

FIG. 5(a) is a schematic top down representation of an electrical interconnect embodiment 500 constructed in accordance with the principles of the present invention. A conductive pad layer 502 is formed on a semiconductor substrate 501. In the depicted embodiment, the conductive pad layer 502 is connected to a current line 504 and includes a plurality of substantially parallel elongate slots 503. Overlying the slots 503 and pad layer 502 is a dielectric layer (not shown in this view) 511. Elongate trenches 508 (indicated by the dashed lines) are formed in the dielectric layer. The trenches 508 are formed over the slots 503. The long axes (shown here by the dot-dashed line 520) of both the trenches 508 and the slots 503 are substantially parallel. Additionally, the trenches 508 extend through the dielectric layer into the slots 503 such that conducting materials deposited in the trenches 508 will make electrical contact with the underlying pad layer 502. In some embodiments, the trenches 508 extend into the slots 503 such that conducting materials deposited in the trenches 508 will make electrical contact with sidewalls of the underlying pad layer 502. Further details of this and other embodiments are explained hereinbelow.

In the depicted embodiment, the semiconductor substrate 501 is a silicon wafer. As with the embodiments described hereinabove, the principles of the invention can be practiced using substrates comprising a number of other semiconductor materials. The conductive pad layer 502 can comprise bond pads, bus lines, or other wide metal line connections as well as a variety of other uses. The depicted pad layer 502 is formed of copper. However, other conductive materials can be used. As above, pad layers 502 can be of any size, but generally range from about 20 $\mu$(micron) ×20 $\mu$ to about 80$\mu$×80$\mu$ or sometimes larger.

FIG. 5(b) is a portion of a cross-section view of the embodiment depicted in FIG. 5(a) taken along line Y–Y'. The pad layer 502 is shown formed on the substrate 501. The dielectric layer 511 is clearly shown. The trenches 508 are formed in the dielectric layer 511 in the regions above the slots 503. As with the foregoing embodiments, it is into these trenches 508 that conductive materials are deposited to form electrical contacts. These trenches 508 can be formed in a variety of ways as is known to those having ordinary skill in the art. These trenches 508 expose portions of the underlying pad layer 502. In particular, the trenches 508 can be used to expose the tops 502T and sidewalls 502s of the pad layer 502. In some embodiments, the trenches 508 are configured to expose only the sidewalls 502s of the pad layer 502.

The trenches 508 are filled with conductive material to form electrical contacts that form electrical connections to the underlying pad layer 502. The depicted embodiment illustrates a trench arrangement where the trenches 508 are over the slots 503 and also configured so that the long axes of the trenches 508 are substantially parallel to the long axis of the slots 503. In the depicted embodiment, a single row of elongate trenches 508 (and hence contacts) is formed in the dielectric layer. As explained above, the inventors contemplate other embodiments wherein several row of elongate trenches are used. In some preferred embodiments, the openings of the trenches 508 are wider than the openings for the slots 503. This exposes a top portion 502T of the pad layer 502. For reasons that will be explained later, this has some advantageous features.

FIG. 5(c) is a cross-sectional depiction of the portion of FIG. 5(b). Once the trenches 508 are formed, one or more barrier layers 510 can be formed in the trench 508. As previously explained, this is necessary when copper-containing materials are used. Many well-known techniques for forming such barrier layers 510 can be used. An electrically conducting contact 521 is then formed in the trench 508. As above, copper-containing or other conductive materials can be used. In preferred embodiments, copper is used. The methods of forming such contacts 521 are well known to persons having ordinary skill in the art.

Once the contact 521 is formed, further processing can be performed. For example, the top of the electrical contacts 521 can be planarized or the tops of the electrical contacts 521 can be capped if desired. The tops of the electrical contacts 521 can also be electrically connected to other circuit elements if desired.

The depicted configuration has substantial advantages over the prior art. For one, an electrical conduction path is now made from the contact 521 through the heretofore unused side portions 502s of the pad layer 502. When these side interconnections are combined with the electrical interconnections at the top portion 502T of the pad layer 502 this approach can be used to produce embodiments having an electrical contact area between the contact 521 and the pad layer 502 that has on the order of five (5) times more electrical contact area than for conventional embodiments. Moreover, because this approach does not lead to open voids from electromigration, this approach offers a much increased electromigration lifetime.

Another embodiment in accordance with the principles of the present invention is directed to methodologies used to form such improved interconnect structures. FIG. 6 is a flow diagram illustrating one embodiment of a method for forming an electrical improved interconnection structure for connection to large electrical contacts.

A semiconductor substrate is provided having a conductive pad layer (Step 601). Typically, but not exclusively, the pad layer has a plurality of elongate slots formed therein.

A number of semiconductor materials can be used to form the substrate. Examples include silicon and gallium arsenide wafers. Moreover, the substrate can be a multi-layered structure. In one example, the substrate can have many layers of semiconductor devices fabricated thereon prior to the implementation of the process of the invention. The top layer can also be a dielectric material (e.g., $SiO_2$, doped $SiO_2$, low-K dielectrics and a list of other materials known to those having ordinary skill in the art).

The substrate includes a conductive pad layer formed thereon. Such conductive pad layers are typically formed of copper-containing materials. Examples include copper pad layers, or copper alloy materials, or copper-containing compounds as well as other metals. The elongate slots can be formed as part of the deposition process that forms the pad layer. Alternatively, the slots can be formed as part of a selective etching process. Other processes known to those having ordinary skill in the art can also be employed to form pad layers with elongate slots. The slots themselves are formed to include sidewalls as illustrated in the foregoing embodiments.

A dielectric layer with a plurality of elongate trenches is formed over the pad layer (Step 603). The elongate trenches can be formed to coincide with the trenches of the pad layer as explained above. Alternatively, the elongate trenches of the dielectric layer can be formed to cross transversely over the trenches of the pad layer as explained with respect to FIG.'s 4(a)–4(d). These elongate trenches can be formed in a variety of ways. For example, trench patterns can be formed by selectively depositing a dielectric material such that trenches are formed in the dielectric layer. Alternatively, damascene or dual damascene processes can be used to form desired trench patterns (i.e., depositing the dielectric layer over the entire surface, then selectively etching away the dielectric material to obtain the desired trench configuration). In either case, elongate trenches are formed in the dielectric layer. These trenches are formed to expose portions of the underlying pad layer.

The dielectric layers can be formed with a wide range of dielectric materials. In one example, silicon dioxide can be used. However, combinations of silicon dioxide and other doped dielectrics (e.g., FSG, BPSG, PSG, etc.) can also be used. Additionally, low-K dielectric materials or other electrically isolating materials are also used. Examples of such materials include, without limitation, spin-on and CVD polymeric materials based on silicon or carbon, or based on combinations of silicon and carbon. Low-K dielectric materials can also be used. Examples of such materials include, but are not limited to: organic thermoplastic and thermosetting polymers such as polyimides, polyarylethers, benzocyclo-butenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include polymers of parylene and napthalene, copolymers of parylene with polysiloxanes or teflon, and polymers of polysiloxane. Moreover, a wide range of proprietary low-K materials including, but not limited to, FLARE (Honeywell Electronic Materials), SiLK (Dow Chemical), or Black Diamond (Applied Materials, Inc.) can be used.

Electrical contacts are then formed in the openings in the dielectric layer to establish electrical connections to the underlying pad layer (Step 605). The formation of the electrical connections to the underlying pad layer can be as simple as depositing an appropriate conductive material in the openings of the dielectric layer. However, in most implementations, the conductive material will be a copper-containing material. Because copper has a deleterious effect on many semiconductor fabrication materials (particularly, dielectrics), barrier materials are commonly used. Methods and materials for such barrier layers are well known to those having ordinary skill in the art. Typically, refractory metals or refractory metals in combinations of refractory metals with other materials are used in barrier layers. Typical examples include, but are not limited to, tungsten (W), tantalum (Ta), and titanium (Ti) based barrier materials (e.g., tantalum nitrides (TaN), tantalum silicon nitrides (TaSiN), tungsten nitrides (WN), and titanium nitrides (TiN)). Additionally, in some implementations where more than one barrier layer is used, additional barrier materials such as Chromium (Cr), Magnesium (Mg), Molybdenum (Mo), or Palladium (Pa), Vanadium (Va) or Tungsten (W) can be used.

Once the barrier layer is formed, a copper material can be used to form the contact. In many approaches, a thin seed layer of copper is deposited, for example, using sputter deposition to deposit the seed layer. Then a thick bulk layer of copper is deposited using, for example, electroplating.

Further processing is then performed on the interconnect structure as needed (Step 607). For example, such further processing can include surface planarization. Such planarization can be accomplished using chemical mechanical polishing (CMP) techniques. Additionally, the tops of the electrical contacts can be capped if desired using similar techniques and materials to those used in the above-disclosed barrier layer. The tops of the electrical contacts can also be electrically connected to other circuit elements if desired.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. An electrical interconnection structure for connection to large electrical contacts comprising:
    a semiconductor substrate having a conductive pad layer formed thereon wherein the conductive pad layer includes a plurality of elongate slots that extend through the conductive pad layer to expose the underlying semiconductor substrate, the slots having a long axis, a short axis, and having sidewalls;
    a dielectric layer overlying the conductive pad layer, the dielectric layer having formed therein a plurality of elongate trenches that extend into the dielectric layer such that electrical connections to the underlying conductive pad layer can be formed wherein the plurality of elongate trenches have a long axis and a short axis and are configured such that the long axes of the trenches lie transverse to the long axes of the elongate slots in the conductive pad layer; and
    a plurality of elongate conductive contacts formed in the elongate trenches to establish electrical connections to the underlying conductive pad layer wherein a top portion of the elongate conductive contacts are electrically connected to other circuit elements and wherein the elongate conductive contacts can be electrically connected to the pad layer through slot sidewalls of the pad layer.

2. The electrical interconnection structure of claim 1 wherein the plurality of elongate trenches in the dielectric layer extend downward to the exposed semiconductor substrate in regions where said trenches overlie the elongate slots in the conductive pad layer; and
    wherein the elongate conductive contacts that are formed in the plurality of elongate trenches extend down to the exposed underlying semiconductor substrate and down to the underlying conductive pad layer to establish electrical connections to the underlying conductive pad layer.

3. An electrical interconnection structure for connection to large electrical contacts comprising:
    a semiconductor substrate having a conductive pad layer formed thereon wherein the conductive pad layer includes a plurality of elongate slots that extend through the conductive pad layer to expose the underlying semiconductor substrate, the slots having a long axis, a short axis, and sidewalls;
    a dielectric layer overlying the conductive pad layer, the dielectric layer having formed therein a plurality of elongate trenches that extend into the dielectric layer such that electrical connections to the underlying conductive pad layer can be formed wherein the plurality of elongate trenches in the dielectric layer have a long axis and a short axis and wherein the elongate trenches are configured such that the long axis of the elongate trenches in the dielectric layer lie substantially parallel to the long axis of the elongate slots in the conductive pad layer; and
    a plurality of elongate conductive contacts formed in the elongate trenches to establish electrical connections to the underlying conductive pad layer wherein a top portion of the elongate conductive contacts are electrically connected to other circuit elements.

4. The electrical interconnection structure of claim 3 wherein the plurality of elongate trenches in the dielectric layer extend downward to the exposed semiconductor substrate in regions where said trenches overlie the elongate slots in the conductive pad layer.

5. The electrical interconnection structure of claim 3 wherein the plurality of elongate trenches in the dielectric layer extend downward to the exposed semiconductor substrate in regions where said trenches overlie the elongate slots such that the elongate conductive contacts can be electrically connected to the pad layer through slot sidewalls of the pad layer.

6. An electrical interconnection structure for connection to large electrical contacts comprising:
    a semiconductor substrate having a copper pad formed thereon, the copper pad includes a plurality of elongate slots that extend into the pad to expose a portion of the underlying substrate such that the substrate is exposed, the elongate slots each including a long axis, a short axis, and sidewalls;
    a dielectric layer overlying the copper pad, the dielectric layer including a plurality of elongate bar trenches that extend into the dielectric layer such that electrical connections to the underlying conductive pad layer can be formed, the bar trenches including a long axis and a short axis; and
    a plurality of elongate conductive contacts that are formed in the plurality of elongate trenches establishing electrical connections to the underlying conductive pad layer.

7. The electrical interconnection structure of claim 6 wherein the elongate conductive contacts are electrically connected to the sidewalls of the copper pads.

8. The electrical interconnection structure of claim 7 wherein the long axes of the plurality of elongate bar trenches are arranged to be substantially parallel to the long axes of the plurality of elongate slots formed in the copper pad.

9. The electrical interconnection structure of claim 8 wherein the elongate conductive contacts include copper material.

10. The electrical interconnection structure of claim 9 wherein the elongate conductive contacts include at least one barrier layer.

11. The electrical interconnection structure of claim 8 wherein a top portion of the elongate conductive contacts are electrically connected to other circuit elements.

12. The electrical interconnection structure of claim 7 wherein the long axes of the plurality of elongate bar trenches are arranged transversely to the long axes of the plurality of elongate slots formed in the copper pad.

13. The electrical interconnection structure of claim 12 wherein the elongate conductive contacts include copper material.

14. The electrical interconnection structure of claim 13 wherein the elongate conductive contacts include at least one barrier layer.

15. The electrical interconnection structure of claim 12 wherein a top portion of the elongate conductive contacts are electrically connected to other circuit elements.

16. The electrical interconnection structure of claim 1 wherein the elongate conductive contacts include copper material.

17. The electrical interconnection structure of claim 3 wherein the elongate contacts include copper material.

* * * * *